United States Patent
Kritzler et al.

(10) Patent No.: US 10,747,389 B2
(45) Date of Patent: Aug. 18, 2020

(54) DISPLAY OF THREE-DIMENSIONAL MODEL INFORMATION IN VIRTUAL REALITY

(71) Applicant: Siemens Aktiengesellschaft, Munich (DE)

(72) Inventors: Mareike Kritzler, San Francisco, CA (US); Matthias Mayr, Karlsruhe (DE)

(73) Assignee: Siemens Aktiengesellschaft, Munich (DE)

( * ) Notice: Subject to any disclaimer, the term of this patent is extended or adjusted under 35 U.S.C. 154(b) by 21 days.

(21) Appl. No.: 16/310,560

(22) PCT Filed: Jun. 9, 2017

(86) PCT No.: PCT/US2017/036721
§ 371 (c)(1),
(2) Date: Dec. 17, 2018

(87) PCT Pub. No.: WO2017/222829
PCT Pub. Date: Dec. 28, 2017

(65) Prior Publication Data
US 2019/0179510 A1 Jun. 13, 2019

Related U.S. Application Data

(60) filed as application No. PCT/US2017/036721 on Jun. 9, 2017.
(Continued)

(51) Int. Cl.
*G06F 3/0481* (2013.01)
*G06F 3/01* (2006.01)
(Continued)

(52) U.S. Cl.
CPC .......... *G06F 3/04815* (2013.01); *G06F 3/011* (2013.01); *G06F 3/017* (2013.01);
(Continued)

(58) Field of Classification Search
CPC ...... G06F 3/017; G06F 3/011; G06F 3/04815; G06F 30/15; G06F 30/23; G06T 19/20; G06T 2200/24; G06T 2219/2016
See application file for complete search history.

(56) References Cited

U.S. PATENT DOCUMENTS 10,156,908 B2 * 12/2018 Stafford ............ G02B 27/0179
2004/0104935 A1 * 6/2004 Williamson ............ G06F 3/012
715/757

(Continued)

OTHER PUBLICATIONS

International Search Report dated Aug. 8, 2017; International Application No. PCT /US2017 /036721; Filing Date: Jun. 9, 2017; 20 pages.
(Continued)

*Primary Examiner* — Muhammad N Edun

(57) ABSTRACT

For display of a 3D model (20) in virtual reality (VR), merely converting the CAD display from the 2D screen to a 3D image may not sufficiently reduce the information clutter. To provide metadata for the 3D CAD model (20) with less occlusion or clutter, a separate space (32) is generated in the virtual reality environment. Metadata and information about the 3D CAD model (20) and/or selected part (36) of the 3D CAD model (20) is displayed (58) in the separate space (32). The user may view the 3D CAD model (20) in one space (30), the metadata with or without a representation of a part in another space (32), or combinations thereof.

19 Claims, 4 Drawing Sheets

Related U.S. Application Data

(60) Provisional application No. 62/353,073.

(51) Int. Cl.
*G06T 19/20* (2011.01)
*G06F 30/15* (2020.01)
*G06F 30/23* (2020.01)

(52) U.S. Cl.
CPC ............ *G06F 30/15* (2020.01); *G06T 19/20* (2013.01); *G06F 30/23* (2020.01); *G06T 2200/24* (2013.01); *G06T 2219/2016* (2013.01)

(56) References Cited

U.S. PATENT DOCUMENTS

| | | | |
|---|---|---|---|
| 2009/0187389 A1 | 7/2009 | Abshire et al. | |
| 2013/0141428 A1 | 6/2013 | Gipson | |
| 2014/0002351 A1 | 1/2014 | Nakayama | |
| 2016/0241836 A1* | 8/2016 | Cole | H04N 13/194 |
| 2016/0337612 A1* | 11/2016 | Im | G06T 19/006 |
| 2018/0321493 A1* | 11/2018 | Kim | G06F 3/012 |

OTHER PUBLICATIONS

Nathan Beattie et al: "Taking the Leap with the Oculus HMO and CAD—Plucking at thin Air?" Procedia Technology, vol. 20, Jun. 29, 2015 (Jun. 29, 2015), pp. 149-154, XP055394856 / Jun. 29, 2017.

Whyte, Jennifer, et al. "From CAD to virtual reality: modelling approaches, data exchange and interactive 3D building design tools." Automation in construction 10.1 (2000): 43-55.

Frooxius. "World of Comenius." World of Comenius | Leap Motion Developers. N.p., Dec. 22, 2014. Web. Jun. 8, 2017.

Donath, Dirk, and Holger Regenbrecht. "Using virtual reality aided design techniques for three-dimensional architectural sketching." Design Computation, Collaboration, Reasoning, Pedagogy. Acadia Conference Proceedings. 1996.

Mujber, Tariq S., Tamas Szecsi, and Mohammed SJ Hashmi. "Virtual reality applications in manufacturing process simulation." Journal of materials processing technology 155 (2004): 1834-1838.

\* cited by examiner

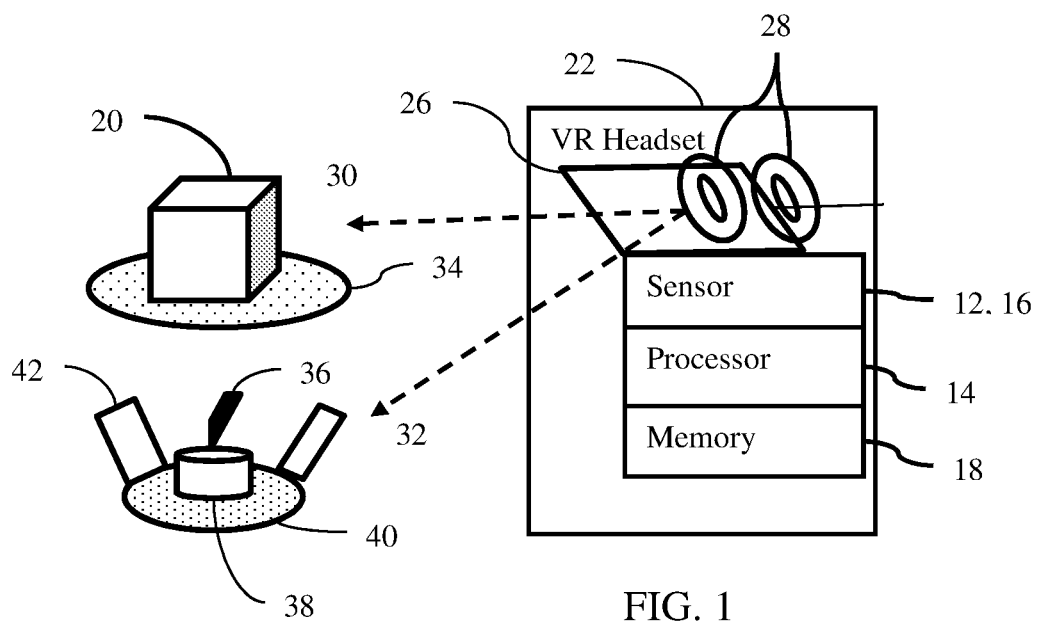
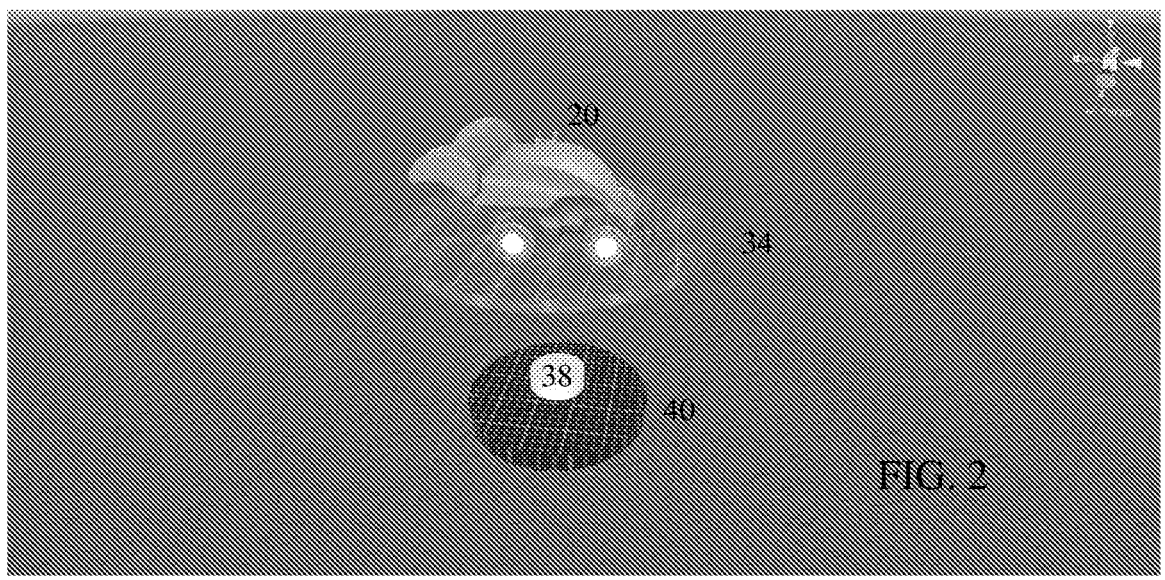

DISPLAY OF THREE-DIMENSIONAL MODEL INFORMATION IN VIRTUAL REALITY

RELATED APPLICATIONS

This application is a national phase filing under 35 U.S.C. § 371 of International Patent Application No. PCT/US2017/036721, filed Jun. 9, 2017, which claims the benefit of priority to U.S. Provisional Patent Application Ser. No. 62/353,073 filed Jun. 22, 2016, which are incorporated herein by reference in their entirety.

BACKGROUND

The present embodiments relate to display of three-dimensional models. Rockets, wind turbines, cars, bikes, shoes, slotted screws, and other objects are designed using computer assisted design (CAD) software. CAD is used to create models of any sizes, for any industries and any purposes. Engineers design, analyze, and simulate the properties of the objects using CAD. Engineers may modify single parts of three-dimensional (3D) CAD models. The parts may be combined into an assembly.

The keyboard and mouse are used to design 3D CAD models on a computer. Computer screens and CAD software provide a high density of information and easy access to different tools for creation, manipulation, and visualization, for example. Vendors of CAD software offer tools to view CAD files as three-dimensional (3D) models rendered to a two-dimensional (2D) screen of a desktop computer. Metadata about the 3D model is displayed on panels that may overlap the 3D model or require the 3D model to be smaller than the real-world dimension to allow for display of a panel. As engineered objects grow in complexity, it becomes much harder to interact with these models and view their connected information. Representing 3D CAD models on a 2D computer screen misses out on the third dimension and displaying functional metadata may become overwhelming.

SUMMARY

By way of introduction, the preferred embodiments described below include methods, systems, instructions, and computer readable media for display of a 3D model in virtual reality (VR). Merely converting the CAD display from the 2D screen to a 3D image may not sufficiently reduce the information clutter. To provide metadata for the 3D CAD model with less occlusion or clutter, an additional space is generated in the virtual reality environment. Metadata about the 3D CAD model and/or selected part of the 3D CAD model is displayed in the additional space. The user may view the 3D CAD model in one space, the metadata with or without a representation of a part in another space, or combinations thereof.

In a first aspect, a system is provided for display of a three-dimensional model in virtual reality. A memory is configured to store the three-dimensional model of an object. A virtual reality headset is configured to display a virtual environment to a user wearing the virtual reality headset. A processor is configured to generate the virtual environment, the virtual environment having (1) a representation of the three-dimensional model positioned on a first side of a surface and (2) a representation of a user selected part of the three-dimensional model and metadata for the user selected part positioned on a second side of the surface.

In a second aspect, a method is provided for display of a three-dimensional model with a virtual reality headset. A first view of a three-dimensional computer assisted design of an arrangement of parts is displayed resting on a first level in a three-dimensional space in the virtual reality headset. User selection of a first part of the arrangement of parts is received. A user view transitions from the first view, through a floor, and to a second view on an opposite side of the floor than the first view on a second level of the three-dimensional space. The first part and information about the first part are displayed at the second view in the virtual reality headset.

In a third aspect, a virtual reality system includes a stereographic display configured to represent an interior of a computer assisted design model in a first space and information about the computer assisted design model in a second space separated from the first space. A user input sensor is configured to receive interaction input from a user. A processor is configured to alter, in response to the interaction input, a user focus from the interior to the information.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

FIG. 1 shows an embodiment of a virtual reality system with a multi-space environment;

FIG. 2 illustrates one example of a multi-space virtual environment;

DETAILED DESCRIPTION OF THE DRAWINGS AND PRESENTLY PREFERRED EMBODIMENTS

Figure 3:
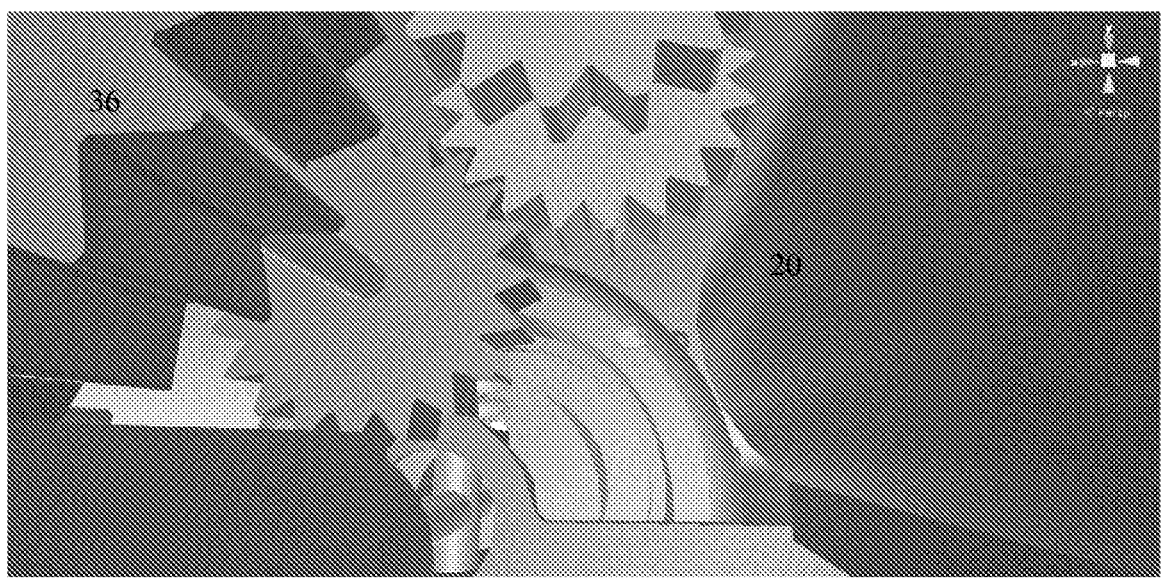
FIG. 3 illustrates an example interior view of a 3D CAD model.

3D CAD models and model information are displayed in a VR environment. CAD is an important part of engineering. CAD programs help to create, analyze and optimize models ranging from screws to airplanes. VR is a computer-simulated world viewed by a user with a headset. The headset features a screen for each eye and tracks the movements of the head with an inertial measurement unit (IMU) for navigating the VR. Artificial worlds may feel real since the application reacts to movements of the body and head. The combination of CAD and VR allows users to explore a 3D CAD model in a VR. The model may be experienced in the actual or another size.

VR may help to explore 3D CAD models more immersively and intuitively compared to visualization on 2D computer screen. The user may interact with and manipulate a virtual representation based on a 3D CAD model. VR systems allow users to experience a virtual world, in which space is unlimited and laws of physics may be excluded or altered. A rich experimentation field allows the user to explore properties of objects yet to be built. In one embodiment, a gravity-free environment allows users to navigate through a displayed model in 3D space and experience both the visual set-up as well as the associated information. VR is a well-suited technology that may close the gap between visualization limitations of 3D models on 2D computer screens and the lack of immersive exploration possibilities.

While exploring 3D CAD models in VR, users may step into the 3D model to learn about parts and details on the inside of the 3D model. In the VR, the users may be completely or mostly surrounded by the 3D model. In this situation, the display of information about the 3D model in general or its parts is not possible without occluding the 3D model or disabling large parts of the virtual 3D model. In addition, the space inside 3D models is very limited. There might not be enough room to display information panels without reorientation. These panels of information may hinder the exploration of the remainder of the 3D model. Panels cover the view and the interaction possibilities with the other parts of the 3D model. Furthermore, the investigated part may be attached to or built-in with other parts of the 3D model, so these other parts of the 3D model may occlude some of the part of interest.

To deal with the large amount of available information with less occlusion, a multi-space (e.g., a two story-floor) metaphor separates between the 3D virtual representation and the associated information. The second level or space is an addition to the "traditional view of viewing" 3D CAD data in VR. This approach allows the display the 3D CAD model and associated information without covering parts of the presented 3D CAD model. Models of all sizes may be explored immersively while still offering enough space to examine a specific part of the 3D model in the separate space. The addition of the separate space from the display of the whole 3D model prevents users from getting lost in the VR world. The direct connection between the two spaces relates the spaces together. The connection may be made by a semi-transparent floor, for example. Users are able to locate the separate space as well as themselves in the virtual world. The introduction of the separate space for displaying a part of the 3D CAD model avoids occlusion by the rest of the 3D model and occlusion by panels that display information next to a part. This separate space may overcome the disadvantages of boards being displayed beside the 3D model since 3D models may be of large objects (e.g., train, automobile, plain, or wind turbine).

FIG. 1 shows one embodiment of a system for display of a 3D model in VR. This VR system is configured to display the 3D model in one space and additional information in an additional separate space. The spaces are connected in a known or intuitive manner, such as being one above the other, for ease of navigation.

The system includes a VR headset 22 with one or more sensors 12, 16, a processor 14, a memory 18, and a stereographic display 26. Additional, different, or fewer components may be provided. For example, motion detecting gloves or motion detection sensor, a microphone, speaker (e.g., headphone), or other VR hardware is provided. As another example, the sensor 12 is not provided.

Figure 6:
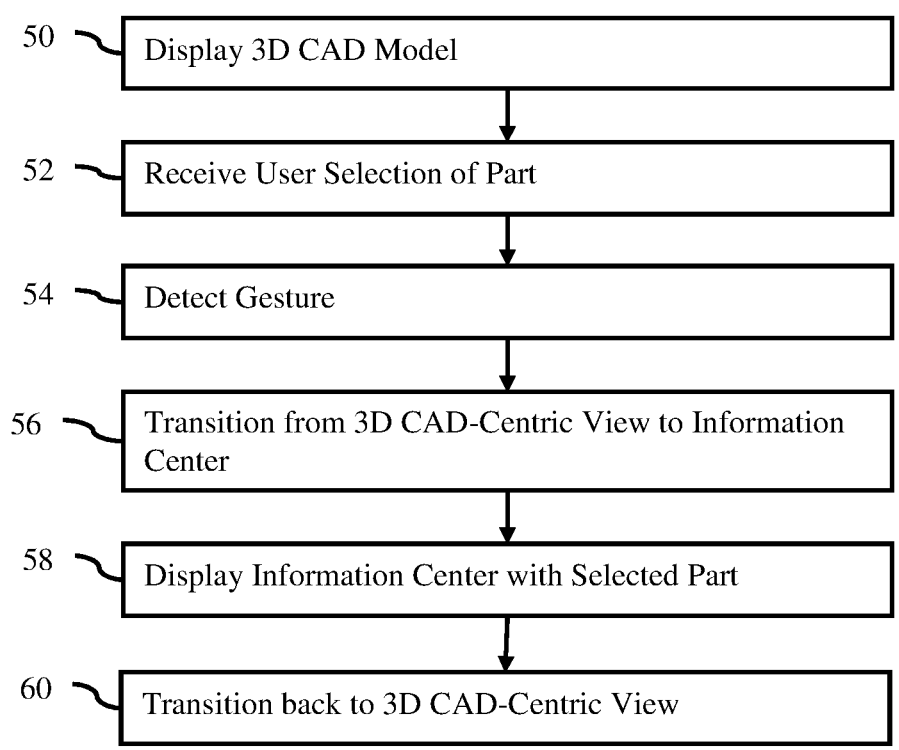
FIG. 6 is a flow chart diagram of one embodiment of a method for display of a three-dimensional model with a virtual reality headset.

The system implements the method of FIG. 6 or a different method. For example, the processor 14 and stereographic display 26 implement acts 50, 56, 58, and 60. The sensor 12 implements act 54. The sensor 12 and/or processor 14 implement act 52. Other components or combinations of components may implement the acts.

The processor 14 and/or memory 18 are part of the VR headset 22. The processor 14 and/or memory 18 are included in a same housing with the stereographic display 26 or are in a separate housing. In a separate housing, the processor 14 and/or memory 18 are wearable by the user, such as in a backpack, belt mounted, or strapped on arrangement. Alternatively, the processor 14 and/or memory 18 are a computer, server, workstation, or other processing device spaced from a user and using communications with the VR headset 22, stereographic display 26 and/or sensor 12. Wired or wireless communications are used to interact between the processor 14, the memory 18, the sensor 12, the display 26, and any other electrical component of the VR headset 22. Separate processors may be used for any of the components.

The memory 18 is a graphics processing memory, video random access memory, random access memory, system memory, cache memory, hard drive, optical media, magnetic media, flash drive, buffer, database, combinations thereof, or other now known or later developed memory device for storing the 3D model, metadata, camera information, stereo images, sensor signals, and/or other information. The memory 18 is part of a computer associated with the processor 14, the VR headset 22, or a standalone device.

The memory 18 is configured to store the 3D model of an object, such as a CAD model of the object 20. During virtual reality navigation, the 3D CAD model or 3D data is used to render or generate stereoscopic views from any potential user viewpoint.

The object 20 is represented by 3D data. For example, a building, an assembly of inter-related parts, or manufactured object 20 is represented by CAD data and/or other engineering data. The 3D data is defined by segments parameterized by size, shape, and/or length. Other 3D data parameterization may be used, such as a mesh or interconnected triangles. As another example, the 3D data is voxels distributed along a uniform or non-uniform grid. Alternatively, segmentation is performed, and the 3D data is a fit model or mesh.

The 3D model represents the geometry of the object 20. One or more surfaces are represented. The 3D model includes surfaces of the object 20 not in view of a virtual camera. 3D CAD is typically represented in 3D space by using XYZ coordinates (vertices). Connections between vertices are known—either by geometric primitives like triangles/tetrahedrons or more complex 3D representations composing the 3D CAD model. CAD data is clean and complete (watertight) and does not include noise. CAD data is generally planned and represented in metric scale. Engineering or GIS data may also include little or no noise. More than one model may be presented, such as two or more 3D models positioned adjacent to each other.

The 3D model may include metadata. The metadata is encoded in the model or is stored separately from the 3D model depending on the file format. The metadata may be one or more labels. The labels are information other than the geometry of the physical object. The labels may be part information (e.g., part number, available options, material, manufacturer, recall notice, performance information, use instructions, assembly/disassembly instructions, cost, and/or availability). The labels may be other information, such as shipping date for an assembly. The label may merely identify the object 20 or part of the object 20. Different metadata may be provided for different parts of an assembly. The metadata may include reference documentation, such as material data sheet, simulation results, test results, recall notices, quality control information, design alternatives, and/or other engineering information. The metadata is information about the 3D model other than the geometry.

The memory 18 or other memory is alternatively or additionally a computer readable storage medium storing data representing instructions executable by the programmed processor 14 or another processor. The instructions for implementing the processes, methods, acts, and/or techniques discussed herein are provided on non-transitory computer-readable storage media or memories, such as a cache, buffer, RAM, removable media, hard drive, or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts, or tasks are independent of the particular type of instructions set, storage media, processor or processing strategy and may be performed by software, hardware, integrated circuits, firmware, micro code and the like, operating alone, or in combination. Likewise, processing strategies may include multiprocessing, multitasking, parallel processing, and the like.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

The VR headset 22 includes a stereographic head-mounted display 26 and an inertial movement sensor 16. Speakers, a microphone and/or other devices may be included. Any now known or later developed VR headset may be used, such as Occulas, Google Cardboard, HTC Hive, PlayStation VR, or Samsung Galaxy VR. In alternative embodiments, one or more projectors are used instead of the stereographic display 26. The projectors project images onto the retina of the user. As another example, an eye tracker (e.g., camera directed at the user's eye) is used to align the perspective with the direction of the user's focus instead of using head motion.

The VR headset 22 is configured to display a virtual environment to a user wearing the VR headset 22. For example, the VR headset 22 is a pair of googles restricting all or most of the user's field of view to the stereographic display 26. The head mounted and/or eyewear device may cover the entire field of view of the user. Part of the field of view of the user may be restricted, such as blocking any viewing in peripheral. The VR headset is head mounted or mountable. For example, the VR headset includes a hat or ring for resting on the head of the user and placing the display 26 in front of the eyes of the user. As a head-mounted display, a harness or helmet supports a display.

The stereographic display 26 includes a separate display for each eye of the user. A barrier limits interference from a display for one eye on the display for the other eye. A single display may be used to show two images, one for each eye. The eye-specific images are rendered from different camera angles and/or positions, providing stereographic images. In alternative embodiments, other stereographic displays may be used.

The inertial movement sensor 16 is a gyroscope, accelerometer, structure light sensor, gravitational field sensor, and/or other device for detecting change in position and/or motion of the user's head or the VR headset 22. Magnetic field sensors may be used to detect the position and/or motion. The inertial movement sensor 16 measures position or change in position, such as a gyroscope for measuring in six degrees of freedom. The perspective of the field of view in the virtual reality adjusts with the user's head movements. In alternative embodiments, user input devices, such as arrow keys, are used instead of inertial movement.

A source of the VR environment is provided, such as the graphics processor 14. The graphics processor 14 generates the images for the stereographic display 26 based on input from the inertial movement sensor 16. The processor 14 generates the multi-space environment for displaying the CAD model and metadata for a user selected part of the CAD model.

The sensor 12 is a user input sensor configured to receive interaction (e.g., navigation) input from a user. A keyboard, mouse, trackball, touch pad, touchscreen, gesture sensor or other user input device is used. The user input sensor measures or receives input from the user for navigating and/or interacting with the virtual environment.

Alternatively or additionally, the sensor 12 is a gesture sensor. For example, a Leap Motion gesture sensor is used to recognize the user's hands. Two cameras and software run on the graphics processor 14 or a separate processor to estimate the position of both hands including fingers. The sensor 12 fixedly or releasably connects with the VR headset 22, such as gluing or being mounted in a front of VR headset 22. A cable or wireless connection is used to provide measurements from the sensor 12. In other embodiments, controllers or sensors are mounted on the user's hands or in gloves for gesture sensing.

An interaction scheme recognizes the user's hand gestures. For example, a pattern (such as pinch) due to motion or position of the hand, hands, finger, and/or fingers is detected. Any number of distinct gestures may be used, such as a pinch (e.g. move, rotate, scale), grab (e.g. move user in the scene); and (3) thumb up (e.g. switch between ground plane and information center) are provided. Each gesture, depending on context, is mapped to a reaction. A direct feedback to users may be provided once a gesture has been recognized. For example, if a pinch or grab is recognized, the hand is highlighted by sparkles whereas the thumbs up gesture instantly triggers the associated action. Alternatively or additionally, the feedback is highlighting or response.

In one embodiment, the VR headset 22 is a smartphone as the processor 14, memory 18, inertial motion sensor 16, and stereographic display 26. A gesture sensor 12 is mounted to the front of the VR headset 22 for viewing the user's hands and/or fingers. Any hardware and/or software may be used, such as a 3D game engine (e.g., Unity), a VR headset (e.g., Google Cardboard), a stereographic display 26 (e.g., smartphone), processor 14 (e.g., smartphone), memory 18 (e.g., smartphone), a gesture sensor (e.g., leap motion), a menu interface (e.g., Hovercast as part of the Hover-VR Interface kit), and a streaming application (e.g., Trinus VR for generating images). Other arrangements may be used.

The processor 14 is a general processor, central processing unit, control processor, graphics processor, graphics processing unit, digital signal processor, three-dimensional rendering processor, image processor, application specific integrated circuit, field programmable gate array, digital circuit, analog circuit, combinations thereof, or other now known or later developed device. The processor 14 is a single device or multiple devices operating in serial, parallel, or separately. The processor 14 may be a main processor of a computer, such as a smart phone, laptop or desktop computer, or may be a processor for handling some tasks in a larger system, such as in the VR headset 22. The processor 14 is configured by instructions, design, firmware, hardware, and/or software to perform the acts discussed herein.

The processor 14, using stereographic imaging, generates the virtual environment. The virtual environment has a representation or display of the 3D CAD model from the memory 18. The representation is of any size by providing an open space that is not limited to the dimension of the displayed 3D CAD model. The VR environment includes multiple spaces 30, 32. These spaces 30, 32 may be viewed simultaneously. For example, the user's perspective is zoomed out to include both spaces. As another example, while the user's perspective is placed in or to view one space, at least part of the other space is viewable due to the orientation of the user.

The spaces 30, 32 are separate. The spaces 30, 32 may be viewed separately without view of the other space 32, 30. Any separation may be used, such as by a wall or surface 34. Alternatively, the spaces 30, 32 are separate by not being connected (i.e., no parts or graphics of one extend into the other or separated by a region or space).

The spaces 30, 32 have a known relationship to each other, such as having a same orientation (e.g., up is the same in both spaces) and/or being aligned by coordinate systems (e.g., same scale so that a part in one is at the same coordinates in the other). One space 32 may shift relative to the other based on a selected part (e.g., place a center of the information center space 32 at a center of a part 36 in the 3D model 20. In one embodiment, the spaces 30, 32 have a known relationship to each other by being adjacent. For example, one is to the left of the other or one is above the other.

In one embodiment shown in FIG. 1, the relationship is by floors or one space 30 is above the other space 32. A semi-transparent ground floor or surface 34 appears to support or hold the entire 3D CAD model 20. The 3D CAD model 20 may be sized according to the current needs to allow closer looks but also a real size experience. The other space 32 is an information center underneath the ground floor or surface 34. This second lower floor is used to examine and display a single part 36 or a sub-assembly of parts as well as to show information 42 (e.g., metadata) about the part 36, sub-assembly, and/or entire 3D CAD model 20. The display in this information center space 32 avoids occluding the 3D CAD model 20.

In the 3D model space, the representation of the 3D model is positioned on a top side of the surface 34 or otherwise positioned in the space 30. The representation is a 3D representation, such as showing the 3D model from a given perspective. The 3D model may be presented as life-size to help with orientation, but any scale, size, height, or other dimensions of the model may be used.

The surface 34 is a ground floor, but may be a wall, ceiling, or other separator. The floor separates a three-dimensional space into different levels. The other space 32 is below the surface 34. The surface 34 is a divider that separates the spaces 30, 32.

The surface 34 is opaque or semi-transparent. For example, the surface 34 is opaque while the user is viewing with a camera positioned above the surface 34 and/or in the space 30. When the camera is positioned away from the 3D model 20, such as a lateral position beyond a border of the surface 34, then the surface 34 is shown as semi-transparent. Alternatively, the surface 34 is always semi-transparent. Semi-transparent includes viewed as a flat surface having a same level of transparency and/or having points or grid lines less transparent than other parts.

The surface 34 has any dimensions and shape, such as being an oval sized to be wider and deeper than the 3D model but as big as the entire 3D model. The size and/or shape of the surface 34 may adapt to the size of the 3D model 20. FIG. 2 shows a car 3D model 20 with the surface 34 extending beyond the 3D model 20 laterally by less than ½ a width or depth of the 3D model 20. FIG. 2 shows the camera positioned above the surface 34, but placed laterally outside of the boundary of the surface 34. The VR environment includes both spaces 30, 32 as simultaneously viewed by the user from this camera position.

Based on input from the sensors 12, 16, the processor 14 generates the virtual environment on the stereographic display 26 to show navigation around, in, and/or through either of the spaces 30, 32, the part 36, and/or the 3D model 20. The user perspective may be changed to view around and/or into the 3D model 20. The navigation may be continuous between and through the different spaces 30, 32, but disjointed navigation between spaces 30, 32 may be provided. Users may explore the 3D model as a whole and select parts or sets of parts of interest. Different types of movement allow the user to choose the most comfortable and best suited movement method. A provided set of tools enables users to interact with the 3D CAD model 20. A menu may be shown at the location of the user's hand in the virtual environment. A board with the menu options may be activated and displayed for selection of menu items.

The user may select a part 36 or sub-assembly. The sensor 12, 16 is activated, triggering of a selection of a part. This approach may not use gravity, allowing users to place parts anywhere in the scene. Alternatively, gravity is used. Physics may allow or not allow the parts to collide if one part is being moved. By not allowing collusion, it may be easier to pick and move any part instead of disassembling the entire 3D CAD model piece by piece. Users can deactivate parts or assemblies to expose build-in parts.

As the user navigates through or relative to the 3D model, the information center space 32 stays on the same relative height, but the content of the information center space 32 may follow the user while exploring 3D CAD model 20. As the user navigates or selects, the information center is updated to include the metadata associated with the currently selected part. This helps users to not lose their orientation when switching to the information center space 32.

FIG. 3 shows an example view of the 3D CAD model 20 with the camera and corresponding perspective of the user being within the 3D CAD model 20. Several different parts 36 are shown in the stereographic display of the interior of the 3D model 20. Only the first space 30 is shown in the perspective of FIG. 3. While the user navigates in the 3D mode, the geometric information is displayed without other metadata. Some metadata may be displayed over one or more parts 36.

When the user selects the part 36, the part 36 may be highlighted. If metadata were to be shown in the space 30 from the interior perspective, then the metadata, such as on a panel or other annotation, would occlude parts of the 3D model 20 otherwise viewable from the given perspective. While exploring a 3D model virtually, users may fully emerge into the scene and be surrounded by the 3D model. In this situation, the display of information about the 3D model in general or its parts is not possible without occluding the 3D model with virtual boards, virtual screens, or virtual panels, shrinking the 3D mode to free up screen space for the metadata, or disabling large parts of the virtual 3D model. Panels or boards beside a model may not be effective for large 3D CAD models, such as airplanes, trains, or ocean liners. By providing the different space 32 for at least some of the metadata, the interior view may be maintained with little or no occlusion from the metadata.

The virtual environment includes the information center space 32 for information other than the geometry of the CAD model 20. A 3D representation of a user selected part 36 of the 3D model 20 and/or metadata for the user selected part 36 are positioned in the other space 32. In the example of FIGS. 1 and 2, the user selected part 36 and the metadata are positioned on a side of the surface 34 opposite the 3D model 20. Stereographic information about the 3D CAD model 20 is presented in the second space 32 separated from the first space 30. By adding a second floor as information center space 32 underneath the ground plane or surface 34, space to examine a singular part or a set of parts while not being attached (but still having the reference to the full model above) to the rest of the 3D model 20 is provided. The selected part 36 and/or metadata may be viewed without occluding the rest of the 3D model 20 but still in a frame of reference with the 3D model.

This information center space 32 empowers users to pick out a specific part 36 or assembly of 3D CAD model 20 and to take a closer look. The part 36 or assembly is not covered by other parts as occurs in the 3D model 20 and users are less likely to be distracted by the rest of the 3D CAD model 20. While the user's perspective or field of view includes or is in the information center space 32, metadata may be displayed without occluding the 3D CAD model 20 and/or the part 36.

Figure 4:
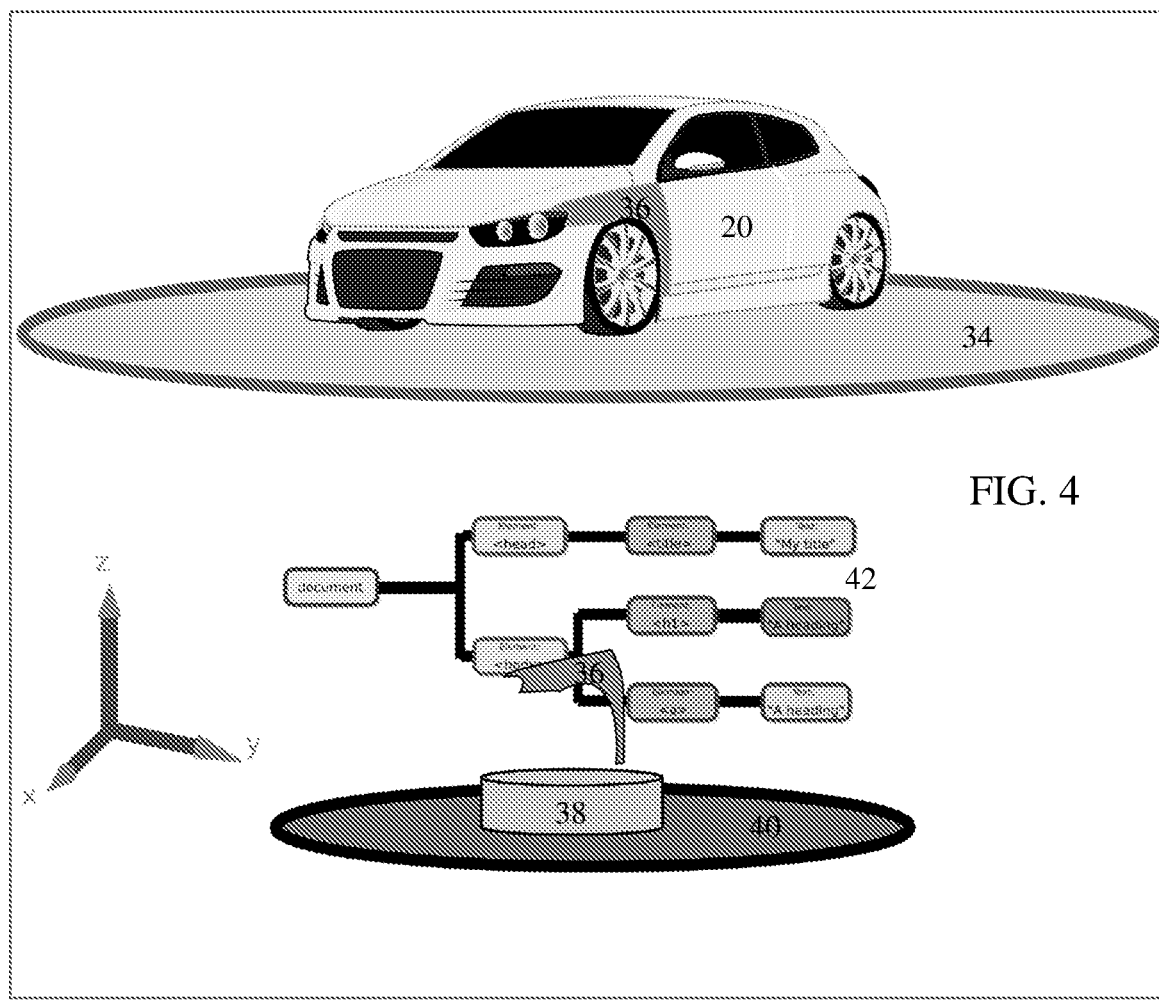
FIG. 4 is another example of a multi-space virtual environment.

FIG. 4 shows one example where the surface 34 is a ground plane of finite extent separating the space 30 for the 3D model 20 from the information center space 32. The information center space 32 includes the user selected part 36 on a pedestal 38. The part 36 is shown on or above a surface 40, such as a floor for the information center space 32. This other surface 40 is semi-transparent or opaque. The part 36 is shown at eye level in an inner region (i.e., centered and/or within the lateral boundary of the floor surface 40). In other embodiments, the pedestal 38 is not provided. The part 36 is show disconnected from the 3D model 20, so may be viewed from any angle without occlusion by other parts of the 3D model 20.

Figure 5:
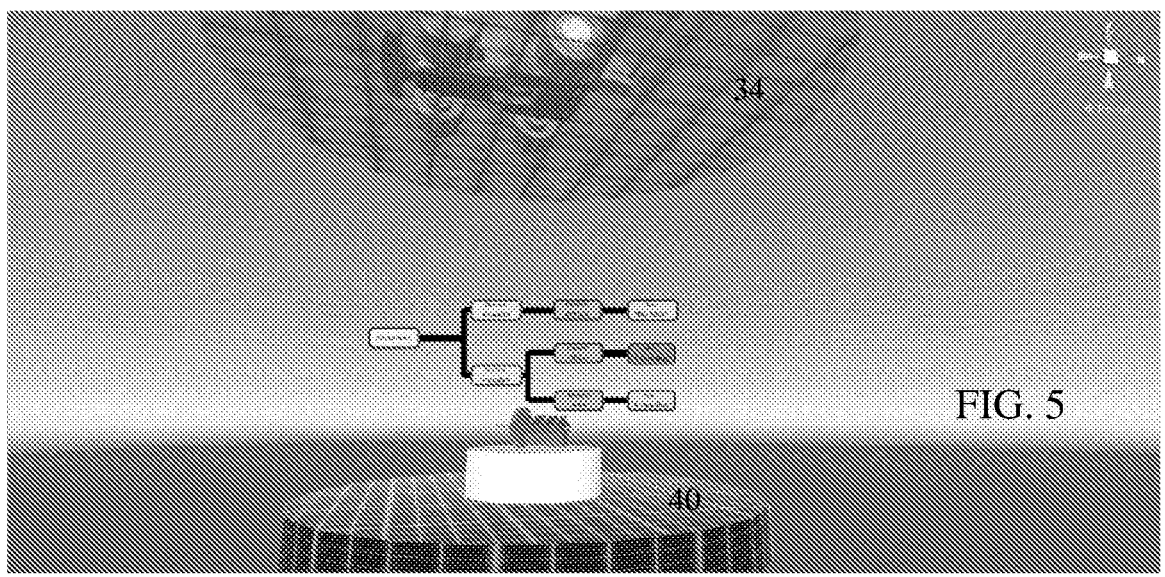
FIG. 5 illustrates an example view of an information center for metadata with part of a 3D CAD model viewable through a semi-transparent surface.

FIG. 5 shows an example where the camera is positioned below the surface 34 and outside of a lateral boundary of the floor surface 40. The user's perspective shows the part 36 on the pedestal 38 below the surface 34, through which part of the 3D model 20 may be seen. The addition of the floor surface 40 allows for a view of the selected object or part 36 without occlusion and a reference to the entire 3D model 20. The floor surface 40 is parallel with the ground surface 34, providing a spatial relationship between the spaces 30, 32.

The metadata is presented in any form. For example, an annotation of alphanumeric text or link is displayed overlaid on the part 36. Images, text, links, lists, graphs, charts, or combinations thereof of the metadata are presented in the information center space 32.

In the embodiments shown in 1, 4, and 5, the metadata is presented one or more panels or boards 42. In FIG. 1, the boards 42 are positioned around the boundary of the floor surface 40. In FIGS. 4 and 5, a tree or menu structure of interconnected boards 42 is shown. The tree of boards 42 is shown behind the part 36 (at least at an initial camera position) and laterally within the boundary of the floor surface 40. Floating text or information without a background board or panel may be used. Any position of the panels or boards may be used, such as a stack and/or positioned laterally outside of the boundary of the floor surface 40.

The information center allows for the display of the 3D model part 36 and metadata for the part 36 without any occlusion. This information center space 32 may be extended to deliver information about the entire 3D model 20, such as including a list of parts and further metadata. The size of the floor 40 may be limited to give users a better orientation while still featuring enough space to display information. The selected part 36 or set of parts is presented at eye level (optionally on top of a platform 38 that holds a virtual keyboard for text input) while virtual boards 42 around the part 36 display the available information or metadata without occluding the displayed part 36. Other arrangements with different boards or panels, different placement, different surface, and/or multiple parts with or without pedestals, may be provided.

To populate the information center space 32 for a particular part 36 or sub-assembly, the user selects the part 36 and/or sub-assembly while navigating in or with a view of the 3D model 20 in the model space 30. For example, a pick and examine tool enables users to take a part or assembly out of the 3D CAD model 20. This tool duplicates the part 36 or assembly and moves or places the duplicate in the information center space 32. Alternatively, a focal point of the user's eyes 28 indicates the part 36 within the 3D model 20, and any part 36 at the focal point is selected and duplicated in the information center space 32. In other embodiments, the part 36 is shown moving from the 3D model 20 to the pedestal 38. The metadata and/or a menu for navigating to metadata for the selected part 36 or sub-assembly is also provided in the information center space 32.

In one embodiment, a panel list, tree-structure, or graph displays part names of the 3D CAD model 20 and allows users to pick a specific part 36, highlight the part 36 in the 3D model 20, and quickly move or place the part 36 in the information center space 32. The list, graph, or structure is provided in the information center space 32. Instead of spending costly time to search for the part 36 by going through the 3D CAD model 20, the user navigates to a board in the information center space 32. This approach may avoid stationary installation of menus or boards next to the displayed 3D CAD model 20 or having menus showing up between parts 36 in the 3D model 20 and occluding some parts of the 3D model 20.

Using the spatial relationship between the two spaces 30, 32, the user camera position and/or perspective may be shifted between the two spaces 30, 32. The perspective of the user is altered between the different sides of the ground surface 34. Any trigger may be used, such as a gesture, voice command, or activation of an input key. In one embodiment, the selection of the part 36 or sub-assembly is the trigger. The trigger causes the alteration in perspective. The perspective shifts from the 3D model 20, such as from within the interior of the 3D model 20, to a same view or orientation in front of the part 36 or sub-assembly in the information center space 32, or vice versa. The perspective shift (a fast transition from the model centric space to the information center in order to avoid motion sickness and user irritation) does not, but may, alter the scale or orientation between the spaces 30, 32.

Where the two spaces are related by top and bottom, the shift may be an elevator emulation or motion. The shift moves the user straight down or up. The elevator alteration may be instantaneous or occur at any rate. For instantaneous, the user 'teleports' with the selected part (i.e., a fast change of coordinates of the camera (which is the user's location)) from the upper 3D model space 30 to the lower floor surface 40 of the information center space 32. For a less than instantaneous elevator motion, the camera shifts up or down gradually, falling or raising through the surface 34. Other motion may be used, such as altering an angle or orientation of the camera or user perspective, moving side to side, zooming out and/or in, or following an arc between the spaces 30, 32 out and past the boundary of the surface 34.

Given the spatial relationship between the spaces, the alteration may be more easily perceived by the user. The processor 14 alters, in response to the interaction input of a trigger, the user focus from the 3D model 20 (e.g., from an interior view—see FIG. 3) to the part 36 and information (e.g., metadata panels) of the information center space 32. The information is initially displayed after the alteration, during the alteration, or before the alteration. The user may interact with the information, such as selecting, highlighting, and/or moving. The information provided in the information center space 32 is provided without occluding the interior of the 3D model 20 since the 3D model 20 is in a separate space 30.

FIG. 6 shows one embodiment of a flow chart of a method for display of a three-dimensional model with a virtual reality headset. In general, the method is directed to navigating around and/or in a 3D CAD model and providing specific part and/or metadata information in a different region to avoid occluding the 3D CAD model with the metadata and/or to provide an unblocked view from any angle of the selected part.

The method is performed by the system of FIG. 1, a graphics processor, a VR headset, or combinations thereof. For example, a stereographic display of a VR headset performs acts 50, 56, 58, and 60. A processor of the VR headset performs act 52. A gesture sensor with or without the processor of the VR headset performs act 54.

The method is performed in the order shown (top to bottom or numeric) or a different order. For example, FIG. 6 shows navigating in the 3D model, transitioning to the information center, then transitioning back. In other embodiments, the initial transition from the information center to the 3D model or a reverse order of transitions is used.

Additional, different, or fewer acts may be provided. For example, only one transition is made (e.g., from the 3D model to the information center or vice versa). In another example, any of the transitions are repeated. In yet another example, other selection than the user selection of act 52 is used. In other examples, a gesture is not detected in act 54, but instead the transition occurs automatically or in response to other input.

In act 50, a view of a 3D CAD of an arrangement of parts resting on a surface is displayed in the virtual reality headset. Any camera position may be used. The user may adjust or change the view to examine the 3D CAD from different positions and/or directions. The 3D CAD may be viewed from an exterior and/or interior.

The view of the 3D CAD of the arrangement is on a surface, such as a ground surface. The surface has any lateral extent, such as being a disc sized to be less than double a lateral extent of the longest width or depth of the 3D CAD. The surface may be infinite. The surface is opaque or semi-transparent. Any pattern may be provided such as including an opaquer grid. No pattern may be provided in other embodiments.

The camera position is above the surface. As the user navigates to view the 3D CAD, the camera is maintained above the surface. The camera may be positioned below the surface and directed at the surface, such as for viewing a bottom of the 3D CAD through the semi-transparent surface. Alternatively, the 3D CAD floats above the surface or may be separated from the surface to allow viewing a bottom while the camera is above the surface. The user may lift, rotate, activate, select, change, or otherwise manipulate the 3D CAD or parts thereof.

In act 52, a user input device and/or processor receives user selection of a part of the arrangement of parts. Alternatively, user selection of the arrangement is received. The user, based on detected hand position and a trigger, selects the part in the VR environment. Eye focus and/or gestures may be used in other embodiments. Selection from a list of parts or other navigation to a part of interest may be used. In yet other embodiments, the selection is automatic or occurs without user input.

In act 54, a sensor with or without the processor detects a gesture of the user. The user moves their hand, hands, and/or fingers in a particular pattern. This movement or placement resulting from the movement is detected. For example, the user balls a hand into a fist with the thumb extended upward. This thumbs-up gesture is detected. In alternative embodiments, other user input is detected, such as activation of a key or a voice command. In yet other embodiments, the user selection of act 52 is used as or instead of the detection of the gesture in act 54.

In act 56, the graphics processor, using the display on the VR headset, transitions a user view from the view of the 3D CAD, through the surface, and to a view on an opposite side of the surface than the view of the 3D CAD. The user's view is transitioned from the 3D CAD to the information and/or part on an opposite side of the surface. The transition is by changing a position of the camera from one side of the surface to another. Where the surface is a wall, the change may be from one side to another laterally. Alternatively or additionally, the transition is by changing an orientation from directed to above the surface to directed to below. Change in zoom may be used.

In one embodiment, coordinate systems on opposite sides of the surface are duplicated or mirrored. The same coordinate or reflection of the same coordinates for the camera are used on the opposite sides of the surface. The camera at position $X_1$, $Y_1$, $Z_1$ and 3D angle $\theta$ (roll left/right, pitch up/down, and/or tilt left/right) above the surface viewing a part in the 3D CAD is repositioned at $X_1$, $Y_1$, $Z_1$ and 3D angle $\theta$ below the surface viewing the part without the rest of the 3D CAD. The user may be at a same height, lateral offset, depth, and angle from the part in both views, but one view is with the part in the 3D CAD and the other view is of the part in the information center (i.e., without the rest of the 3D CAD). In alternative embodiments, different relative positioning is provided for the views on the different sides of the surface.

Any transition motion may be used. For example, the transition is as an elevator moving the user's perspective downward or upward. The transition changes the position only along one dimension. The orientation and/or zoom are constant or do not change. The user may continue to navigate, resulting in change in other dimensions, angle, or zoom during the transition. The transition is instantaneous, such as moving from one position to the next without any intermediate views. Alternatively, the transition is gradual, including one or more intermediate views as the camera position changes. In other embodiments, the transition motion is along an arc or other non-straight path with or without change in scale (i.e., zoom) and/or angle.

The transition occurs in response to the detecting of the gesture in act 54. Other triggers may be used.

In act 58, the graphics processor, in the display of the VR headset, displays the user selected part and information about the user selected part at the view after transition. Any camera position may be used. Initially, the camera position at the end of the transition is used. The user may adjust or change the view to examine the 3D part and/or information from different positions, scales, and/or directions.

The view of the part is on a surface and/or pedestal. The surface and/or pedestal has any lateral extent, such as the surface being at least twice the lateral extent of the pedestal and the pedestal being sized to be less than 1.5 times a lateral extent of the longest width or depth of the part. The surface may be infinite. The surface and/or pedestal are opaque or semi-transparent. Any pattern may be provided such as including an opaquer grid. No pattern may be provided in other embodiments.

The camera position is above the surface of the information center. As the user navigates to view the part or information, the camera is maintained above the surface of the information center and below the surface for the 3D CAD. The camera may be positioned below the surface of the information center and directed at the surface, such as for viewing a bottom of the part through the semi-transparent surface. Alternatively, the part floats above the surface or may be separated from being adjacent or on the surface to allow viewing a bottom while the camera is above the surface. The user may lift, rotate, activate, select, change, or otherwise manipulate the part. The camera may be positioned above the 3D CAD surface viewing the part and/or metadata of the information center.

The information is displayed as being on one or more boards. The panel or board may be opaque, semi-transparent, or transparent. The link, alphanumeric text, graph, chart, and/or other representation of information about the part are provided on one or more virtual boards. The boards have any placement, such as around the boundary of the surface of the information center (e.g., as partial walls). The boards are spaced from the pedestal and the part to avoid occluding views of the part. The boards may be floating or supported (e.g., presented as signs). The boards may be flat or curved. The user may interact with the boards or content of the boards, such as navigating through content on one or more boards (e.g., selecting information on a board activates another board and/or replaces text with new text).

In act 60, the processor, in the display of the VR headset, transitions from the view of the part and/or information to the 3D CAD of the arrangement. The same or different trigger (e.g., thumbs-up) is used. In response to detecting the trigger, the view transitions to the other side of the surface between the spaces. The transition alters the camera in just one dimension without orientation or scale change, but other alterations may be used. The user may transition the view to select a different part and/or to examine the interaction or placement of the previously selected part relative to other portions of the 3D CAD. The user may alter the part (such as color) and transition to view the results of the alteration relative to the 3D CAD.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A system for display of a three-dimensional model in virtual reality, the system comprising:
    a memory configured to store the three-dimensional model of an object;
    a virtual reality headset configured to display a virtual environment to a user wearing the virtual reality headset, comprising gesturing sensors for enabling the user to view the virtual environment by navigation and to select items displayed in the virtual environment; and
    a processor, configured to generate the virtual environment, the virtual environment having a three-dimensional space divided into a first space and a second space, wherein the first space contains a representation of the three-dimensional model positioned in the first space and the second space contains a representation of a user selected part of the three-dimensional model and one or mote labels with annotated metadata for the user selected part,
    wherein contents of the second space are generated responsive to the user selecting a part from the three-dimensional model using the gesturing sensors,
    wherein the virtual environment includes a separation between the first space and the second space displayed as a semi-transparent surface,
    wherein the navigation includes transitioning from a first view within the first space, through the surface to a second view within the second space, and the second view displays the contents of the first space and the second space from a perspective of the second space.

2. The system of claim 1 wherein the three-dimensional model comprises a computer assisted design model of the object, the object including a plurality of inter-related parts including the user selected part.

3. The system of claim 1 wherein the virtual reality headset comprises a stereographic head-mounted display and an inertial movement sensor.

4. The system of claim 1 wherein the virtual reality headset comprises a gesture sensor, the processor configured to alter a perspective of the user between the first and second sides of the surface in response to a gesture detected by the gesture sensor.

5. The system of claim 1 wherein the surface is a ground plane on which the three-dimensional model rests and the second side is below the ground plane, wherein the processor is configured to alter a perspective of the user between the first and second sides as an elevator motion.

6. The system of claim 1 wherein the surface is semi-transparent.

7. The system of claim 1 wherein the representation of the metadata comprises boards with images, text, or images and text of the metadata, the boards positioned around an outer region with the representation of the user selected part positioned in an inner region.

8. The system of claim 1 wherein the representation of the user selected part is disconnected from the three-dimensional model and is on a pedestal displayed on a second surface.

9. The system of claim 1 wherein the processor is configured to navigate perspective around and into the three-dimensional model and to select the user selected part.

10. The system of claim 1 wherein the representation of the three-dimensional model is free of occlusion from the metadata.

11. A method for display of a three-dimensional model with a virtual reality headset, the method comprising:

displaying a first view of a three-dimensional computer assisted design of an arrangement of parts resting on a first level of a three-dimensional space in the virtual reality headset;

receiving user selection of a first part of the arrangement of parts;

transitioning a user view from the first view, through a semi-transparent floor of the first level, and to a second view being of a second level of the three-dimensional space; and displaying the first part and information about the first part at the second view in the virtual reality headset and displaying the semi-transparent floor and at least part of the arrangement of parts of the first level from a perspective of the second view.

12. The method of claim 11 wherein the floor comprises a ground surface on which the arrangement of parts rests, and wherein transitioning comprises transitioning as an elevator moving the user's perspective downward.

13. The method of claim 11 wherein transitioning comprises transitioning without altering a user orientation.

14. The method of claim 11 further comprising detecting a gesture with a gesture sensor, and wherein the transitioning occurs in response to the detecting of the gesture.

15. The method of claim 11 further comprising transitioning from the second view back to the first view.

16. The method of claim 11 wherein displaying the first part and the information comprises displaying the first part on a pedestal and displaying the information as virtual boards spaced from and positioned around the pedestal.

17. A virtual reality system comprising:

a stereographic display configured to represent an interior of a computer assisted design model in a first space of a three-dimensional virtual environment and information about the computer assisted design model in a second space of the three-dimensional virtual environment separated from the first space by a semi-transparent surface, wherein the stereographic display displays the first space, the semi-transparent surface and at least part of the second space separated from the first space by the semi-transparent surface;

a user input sensor configured to receive user interaction input from a user; and a processor configured to alter, in response to the interaction input, a user focus as a transition from a first view from the interior, through the semi-transparent surface, to a second view in the second space for viewing the information, wherein the second view is displayed from a perspective that shows the first space, the semi-transparent surface and the second space from a perspective in the second space.

18. The virtual reality system of claim 17, wherein the interior is displayed without the information prior to the alteration, and wherein the information is displayed after the alteration and without occluding the interior.

19. The virtual reality system of claim 17 wherein a semi-transparent ground plane separates the first space from the second space and wherein the alteration emulates an elevator moving from the first space to the second space.

* * * * *